(12) United States Patent
Peng et al.

(10) Patent No.: US 9,147,810 B2
(45) Date of Patent: Sep. 29, 2015

(54) LIGHT EMITTING DIODE AND METHOD FOR MANUFACTURING THE SAME

(71) Applicant: ADVANCED OPTOELECTRONICS TECHNOLOGY, INC., Hsinchu Hsien (TW)

(72) Inventors: Chien-Chung Peng, Hsinchu (TW); Tzu-Chien Hung, Hsinchu (TW); Chia-Hui Shen, Hsinchu (TW)

(73) Assignee: ADVANCED OPTOELECTRONIC TECHNOLOGY, INC., Hsinchu Hsien (TW)

( * ) Notice: Subject to any disclaimer, the term of this patent is extended or adjusted under 35 U.S.C. 154(b) by 0 days.

(21) Appl. No.: 13/956,308

(22) Filed: Jul. 31, 2013

(65) Prior Publication Data
US 2014/0124808 A1    May 8, 2014

(30) Foreign Application Priority Data
Nov. 2, 2012 (CN) .......................... 2012 1 0431876

(51) Int. Cl.
*H01L 33/00* (2010.01)
*H01L 33/42* (2010.01)
*H01L 33/44* (2010.01)
*H01L 33/50* (2010.01)

(52) U.S. Cl.
CPC ............... *H01L 33/42* (2013.01); *H01L 33/44* (2013.01); *H01L 33/508* (2013.01)

(58) Field of Classification Search
CPC ....................................... H01L 33/0004–33/648
See application file for complete search history.

(56) References Cited

U.S. PATENT DOCUMENTS

| 2011/0156579 A1* | 6/2011 | Jo et al. .......................... 313/506 |
| 2012/0012869 A1* | 1/2012 | Song ................................ 257/91 |

* cited by examiner

*Primary Examiner* — David Vu
*Assistant Examiner* — Cuong Nguyen
(74) *Attorney, Agent, or Firm* — Novak Druce Connolly Bove + Quigg LLP

(57) ABSTRACT

A light emitting diode (LED) includes a base, an LED die grown on the base, a transparent electrically conductive layer formed on a side of the LED die, a protecting layer covering the transparent electrically conductive layer, and a phosphor layer formed on the protecting layer. Through holes extend through the phosphor layer and the protecting layer to make part of light emitted from the LED die directly traveling out from the through holes to illuminate. A method for manufacturing the LED is also provided.

7 Claims, 3 Drawing Sheets

LIGHT EMITTING DIODE AND METHOD FOR MANUFACTURING THE SAME

BACKGROUND

1. Technical Field

The present disclosure relates to semiconductor devices and, more particularly, to a light emitting diode (LED).

2. Description of Related Art

In recent years, LEDs have been widely used in devices to provide illumination. Typically, an LED includes an LED die and a phosphor layer directly formed on a light outputting surface of the LED die and entirely covering the light outputting surface. Light emitted from the LED die radiates from the light outputting surface and excites phosphor substance of the phosphor layer to emit excitation light, thereby obtaining a mixed white light. However, the phosphor layer will absorbs part of light of the LED die and reflects part of light of the LED die. Thus, a light outputting efficiency of the LED will be unfavorably affected.

Accordingly, it is desirable to provide an LED which can overcome the described limitations.

DETAILED DESCRIPTION

Embodiments of an LED will now be described in detail below and with reference to the drawings.

Figure 1:
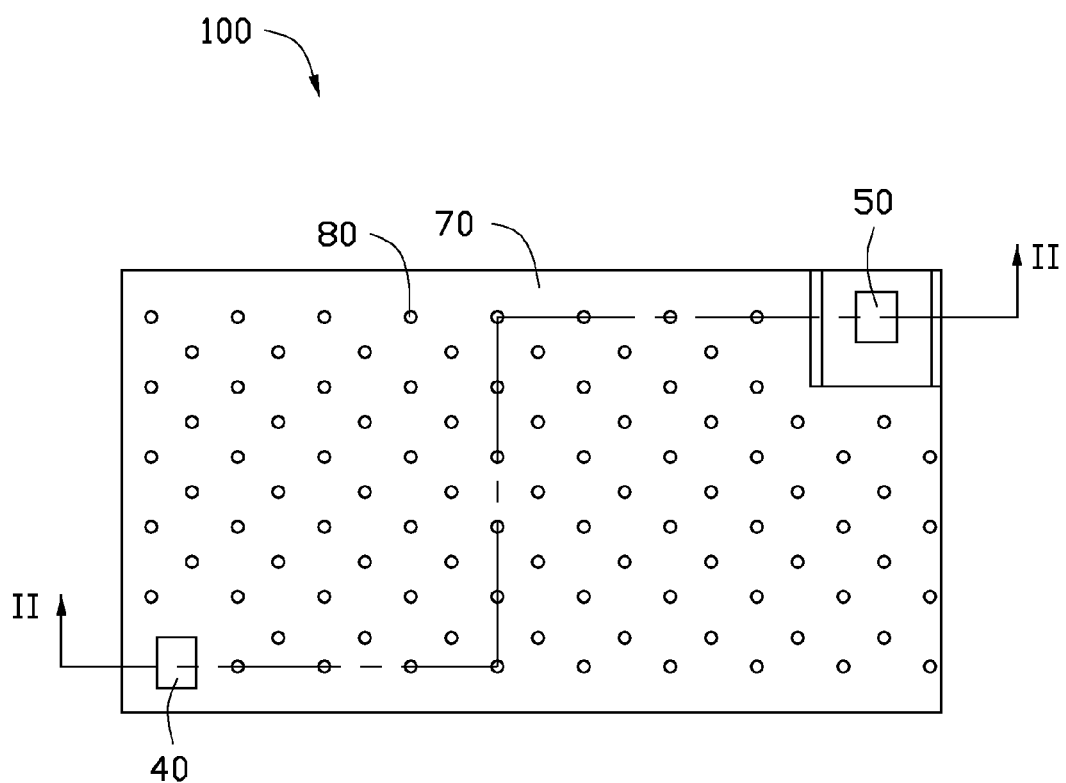
FIG. 1 is a top view of an LED according to an exemplary embodiment of the present disclosure.
Figure 2:
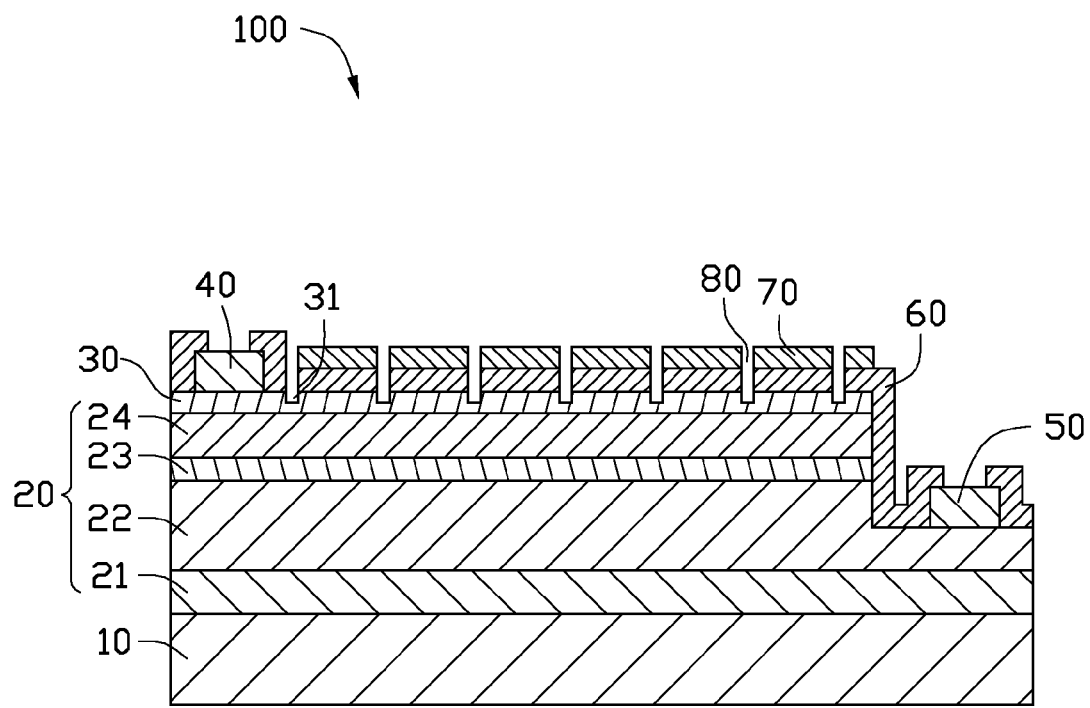
FIG. 2 is a cross sectional view of the LED of FIG. 1, taken along II-II line thereof.

Referring to FIGS. 1-2, an LED 100 according to an exemplary embodiment is shown. The LED 100 includes a base 10, an LED die 20 grown on the base 10, a transparent electrically conductive layer 30 formed on the LED die 20, a P-type electrode 40, an N-type electrode 50, a protecting layer 60 formed on the transparent electrically conductive layer 30, and a phosphor layer 70 formed on the protecting layer 60.

The base 11 is electrically insulated and made of sapphire, SiC, Si, GaAs, LiAlO$_2$, MgO, ZnO, GaN, AlO, or InN. In this embodiment, the base 11 is made of sapphire.

The LED die 20 includes a buffer layer 21 formed on a top surface of the base 10, an N-doped region 22 formed on a top surface of the buffer layer 21, an active layer 23 formed on a top surface the N-doped region 22, a P-doped region 24 formed on a top surface of the active layer 23. In this embodiment, the buffer layer 21 may be made of GaN, AlGaN, AN, or InGaN. The active layer 23 may be a single quantum well structure, a multiple quantum well structure, and/or quantum dot structure.

The transparent electrically conductive layer 30 is formed on a top surface of the P-doped region 24. Right sides of the transparent electrically conductive layer 30, the P-doped region 24, the active layer 23 are etched to expose a right side of the N-doped region 22. In this embodiment, a top portion of the right side of the N-doped region 22 is etched also. In this embodiment, the transparent electrically conductive layer 30 is formed by evaporating or sputtering and made of Ni/Au, Indium Tin Oxide, Indium Zinc Oxide, Indium Tungsten Oxide, or Indium Gallium Oxide. Alternatively, the transparent electrically conductive layer 30 is made of Zinc oxide or Indium Gallium Zinc Oxide.

The P-type electrode 40 is formed on the transparent electrically conductive layer 30. The N-type electrode 50 is formed on a top surface of the exposed right side of the N-doped region 22. In this embodiment, the P-type electrode 40 and the N-type electrode 50 are formed by evaporating or sputtering.

The protecting layer 60 is transparent and covers a top surface of the transparent electrically conductive layer 30, lateral edges of the P-type electrode 40 and the N-type electrode 50, and the top surface of the exposed right side of the N-doped region 22, right ends of the P-doped region 24 and the active layer 23. A central portion of a top surface of the P-type electrode 40 and a central portion of a top surface of the N-type electrode 50 are exposed. In this embodiment, a material of the protecting layer 60 is selected from SiO$_2$, epoxy, Si$_3$N$_4$, TiO$_2$, and AlN. A top end of the transparent electrically conductive layer 30 is etched to define a plurality of recesses 31 therein. The recesses 31 act as a roughened structure of the LED die 20 to reflect light oriented thereto toward different directions to change an incidence angle of the light, thereby improving the light extraction efficiency of the LED 100.

The phosphor layer 70 covers the protecting layer 60 located on the transparent electrically conductive layer 30. In this embodiment, the active layer 23 emits blue light. The phosphor layer 70 is formed by yellow phosphor, or mixed by red phosphor and green phosphor. The phosphor layer 70 and a part of the protecting layer 60 located between the transparent electrically conductive layer 30 and the phosphor layer 70 are etched along a height direction of the LED 100 to define a plurality of through holes 80 therein. The through holes 80 are evenly spaced from each other and respectively aligned with the recesses 31. The transparent electrically conductive layer 30 is exposed via the through holes 80. In this embodiment, a rate of surface areas of the phosphor layer 70 and the through holes 80 is ranged from 0.2 to 0.4.

Figure 3:
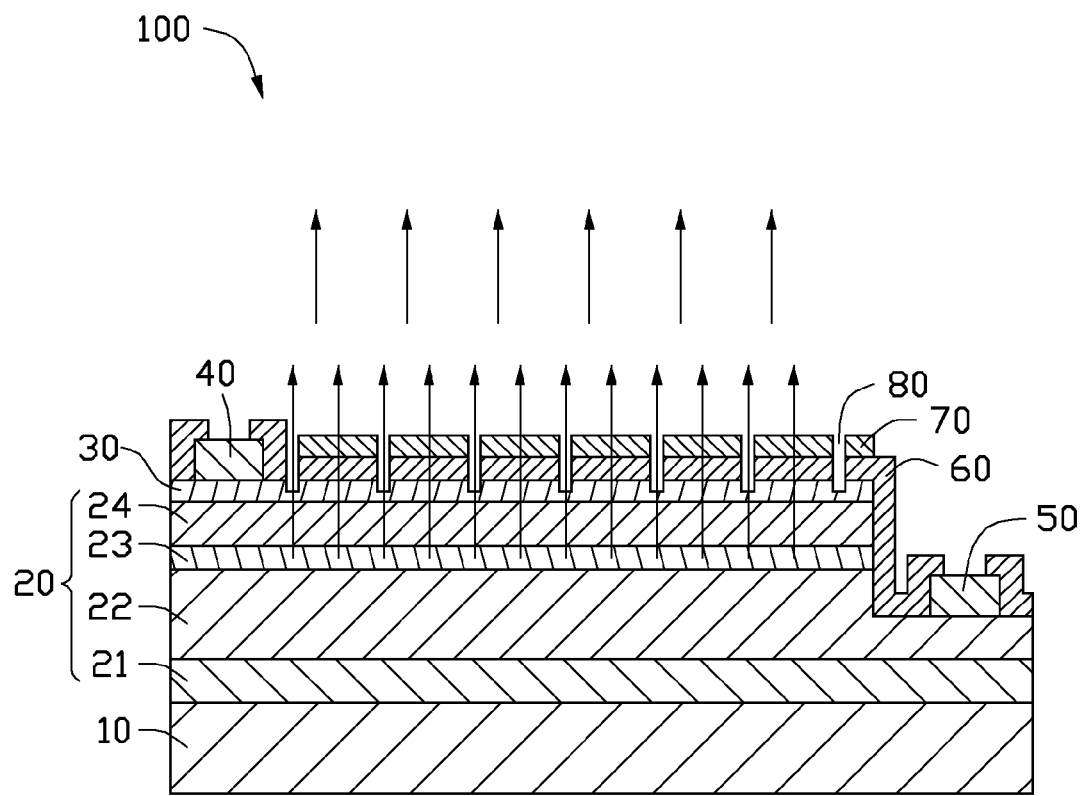
FIG. 3 shows light paths of the LED.

Referring to FIG. 3, a part of the light emitted from the active layer 23 directly travels out from the through holes 80 to form a first light with a first wavelength, and another part of the light travels through the phosphor layer 70 to excite the phosphor layer 70 to emit a second light with a second wavelength. The first light and the second light are mixed to form a determined white light.

In this disclosure, because a part of the light emitted from the active layer 23 directly travels through the through holes 80, without traveling through the phosphor layer 70, thus, the light absorbed by the phosphor layer 70 relative to the conventional LED is decreased. Therefore, the light outputting efficiency of the LED 100 is improved.

A method for manufacturing the LED 100 includes following steps.

The first step is providing the base 10.

The second step is growing the LED die 20 on the base 10.

The third step is forming the transparent electrically conductive layer 30 on the LED die 20 by evaporating or sputtering.

The fourth step is etching the right sides of the transparent electrically conductive layer 30, the P-doped region 24 and the active layer 23 to expose the right side of the N-doped region 22, and forming the N-type electrode 50 and the P-type electrode 40 on the exposed right side of the N-doped region 22 and the transparent electrically conductive layer 30.

The fifth step is forming the protecting layer 60 on the LED die 20.

The sixth step is forming the phosphor layer 70 on the protecting layer 60 located on the transparent electrically conductive layer 30.

The seventh step is etching the phosphor layer 70, a part of the protecting layer 60 located between the transparent electrically conductive layer 30 and the phosphor layer 70, and the top end of the transparent electrically conductive layer 30 to define the through holes 80 through the etching the phosphor layer 70 and the protecting layer 60, and the recesses 31 of the transparent electrically conductive layer 30.

It is to be further understood that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A light emitting diode (LED) comprising:
    a base;
    an LED die grown on the base, an N-type electrode and a P-type electrode formed on right and left ends of the LED die, respectively;
    a transparent electrically conductive layer only formed on a left end of a top surface of the LED die, the P-type electrode directly formed on the transparent electrically conductively layer;
    a protecting layer covering the transparent electrically conductive layer and lateral edges of the N-type electrode and the P-type electrode, and the protecting layer being continuous; and
    a phosphor layer formed on the protecting layer, only covering a part of the protecting layer located on the transparent electrically conductive layer and located between and spaced from inner sides of the N-type electrode and the P-type electrode which face to each other;
    wherein a plurality of through holes extends through the phosphor layer and the protecting layer to make part of light emitted from the LED die directly traveling out from the through holes to illuminate, and the N-type electrode and the P-type electrode are only covered by the protecting layer.

2. The LED of claim 1, wherein a plurality of recesses is defined in a top of the transparent electrically conductive layer to roughen a top surface of the transparent electrically conductive layer.

3. The LED of claim 2, wherein the recesses are respectively aligned with the through holes.

4. The LED of claim 2, wherein a rate of surface areas of the phosphor layer and the through holes is ranged from 0.2 to 0.4.

5. The LED of claim 1, wherein the LED die comprises a buffer layer, an N-doped region, an active layer, and a P-doped region formed on the base in series, and the transparent electrically conductive layer is formed on a top surface of the P-doped region.

6. The LED of claim 5, wherein right sides of the transparent electrically conductive layer, the P-doped region and the active layer are etched to expose a right side of the N-doped region, and the N-type electrode and the P-type electrode are respectively formed on the exposed right side of the N-doped region and the transparent electrically conductive layer.

7. The LED of claim 6, wherein the protecting layer is transparent and covers a top surface of the transparent electrically conductive layer, the top surface of the exposed right side of the N-doped region, and right ends of the P-doped region and the active layer.

* * * * *